(12) United States Patent
Connors et al.

(10) Patent No.: US 6,193,090 B1
(45) Date of Patent: Feb. 27, 2001

(54) REUSABLE CONTAINER

(75) Inventors: Paul A. Connors, Eagan; Gerald J. Niles; John M. Darst, both of Oakdale, all of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/287,072

(22) Filed: Apr. 6, 1999

(51) Int. Cl.[7] .................................................. B65D 6/10
(52) U.S. Cl. ..................... 220/4.24; 220/4.21; 206/394; 206/445
(58) Field of Search ..................... 220/4.24, 4.21, 220/682; 206/394, 303, 403, 523, 311, 445

(56) References Cited

U.S. PATENT DOCUMENTS

| 3,148,822 | 9/1964 | Yochum, Jr. ............... | 229/45 |
| 4,003,468 | 1/1977 | Berkman .................... | 206/387 |
| 4,253,571 | * 3/1981 | Keohan ..................... | 206/308.3 |
| 4,482,074 | 11/1984 | Lalley ....................... | 220/4 F |
| 4,708,246 | * 11/1987 | Minion ....................... | 206/394 |
| 4,883,178 | * 11/1989 | Thiele et al. .............. | 206/391 |
| 5,007,536 | 4/1991 | Huebner et al. .......... | 206/394 |
| 5,253,756 | 10/1993 | Goekler .................... | 206/444 |
| 5,303,823 | 4/1994 | Niles et al. ............... | 206/394 |
| 5,310,070 | * 5/1994 | Haas et al. ............... | 220/4.24 |
| 5,366,079 | * 11/1994 | Lin et al. .................. | 206/710 |
| 5,501,351 | 3/1996 | Niles et al. ............... | 220/4.21 |
| 5,553,711 | * 9/1996 | Lin et al. .................. | 206/710 |
| 5,780,127 | 7/1998 | Mikkelsen ................ | 428/35.7 |
| 5,782,362 | 7/1998 | Ohori ........................ | 206/711 |
| 5,788,082 | 8/1998 | Nyseth ...................... | 206/711 |
| 5,788,304 | 8/1998 | Korn et al. ................ | 296/159 |
| 5,833,067 | 11/1998 | Joshi ......................... | 206/454 |
| 5,875,896 | 3/1999 | Liang ........................ | 206/710 |

FOREIGN PATENT DOCUMENTS

| 0 789 393 A1 | 8/1997 | (EP) | ............ | H01L/21/68 |
| 2 293 816 | 4/1996 | (GB) | ............ | B65D/25/10 |

OTHER PUBLICATIONS

FR 2246458 French reference, inventor; Hefendehl, date: May 1975 drawings and Abstract (no spec. and no claims.*
Alberghini et al., "Technology, Performance, Markets, Economics—The Complete Blow Molding Operation", *Blow Molding Handbook,* pp. 15–52, 1988.
Kirkham et al., "Injection molding", *Modern Plastics,* Mid–Oct. Encyclopedia Issue, pp. 286–296, 1989.
Whiteside, "Theromoforming", *Modern Plastics,* Mid–Oct. encyclopedia Issue, pp. 318–322, 1989.

* cited by examiner

Primary Examiner—Stephen Castellano
(74) Attorney, Agent, or Firm—Douglas B. Little; Charles L. Dennis, II; Dean M. Harts

(57) ABSTRACT

Disclosed is a container having top, bottom, and side walls that comprises first and second substantially identical halves, each of which has a major surface that has a polygonal shape defined by at least six sides and at least one substantially vertical side wall, substantially orthogonal to the major surface, that forms a portion of the side walls of the container when the halves are assembled, an at least double wall construction, the two substantially identical halves matingly engage when the halves are assembled to form the container, and means integral to each half for securing the two halves together. In another aspect, the container of the invention comprises a major surface having a curved periphery and is otherwise as summarized above.

10 Claims, 5 Drawing Sheets

REUSABLE CONTAINER

FIELD OF THE INVENTION

This invention relates to containers. More particularly, the present invention relates to reusable and recyclable storage and shipping containers.

BACKGROUND

It is a prevailing practice in industry to use containers for shipping and storing quantities of input materials and finished products. Containers are frequently made from corrugated cardboard, chipboard, and plastics. The container contents are commonly cushioned with dunnage materials such as bubble wrap, packaging peanuts, and foamed polymeric materials. Many such containers and cushions are intended to be discarded after a single use by the end user receiving the contents. The disposal of these packaging materials raises waste disposal and environmental concerns, and the nature of these packaging systems can render them difficult to dispose in an environmentally sound manner.

In the semiconductor industry, many types of silicon wafer containers have been utilized. These containers typically are supposed to protect brittle silicon wafers, minimize contamination from particulates, and minimize static electricity buildup.

U.S. Pat. No. 5,007,536 describes a packaging container formed from two substantially identical parts for a plurality of circular recording media. This container is formed from foamed plastic by pressing, casting, injection molding or deep drawing. The parts have a multitude of teeth that tightly interfit upon assembly of the container. However, integral means for holding the container parts together are not disclosed. A cylindrical central holder is used to support the recording media.

G.B. 2293816 A describes a carrier for wafers that includes a method of cushioning. The carrier assembly uses three different parts.

E.P. 0789393 A1 describes a semiconductor wafer container made with a main body and a lid body that are not of similar shapes. The two parts are detachably fixed together by turning the lid body to align protrusions of the main body with slots in the lid body.

U.S. Pat. 5,780,127 describes a dimensionally stable and static dissipative carrier for semiconductor wafers. Three different parts are used to enclose the wafers for shipping.

U.S. Pat. No. 5,788,082 describes a three-piece wafer container using a top portion, a bottom portion, and separately molded wafer support columns. A separate side handle secures the molded portions together.

U.S. Pat. No. 5,303,823 describes a parallelepipedal storage container formed from two substantially identical foldable rectangular halves. This container is formed by folding each half into the shape of a U, and sliding and securing the two halves together. The container may be blow-molded for a double-wall construction, or alternatively, injection molded.

SUMMARY OF THE INVENTION

The present invention is summarized as a container having top, bottom, and side walls that comprises
A) first and second substantially identical halves, each of which has a major surface that has a polygonal shape defined by at least six sides and at least one side wall, substantially orthogonal to the major surface, that forms a portion of the side walls of the container when the halves are assembled;
B) at least a double wall construction;
C) the two substantially identical halves matingly engage when the halves are assembled to form the container; and
D) means for securing the two halves together which is integral with each half.

In another aspect, the invention is summarized as a container having top, bottom, and side walls that comprises
A) first and second substantially identical halves, each of which has a major surface the periphery of which is curved and at least one side wall, substantially orthogonal to the major surface, that forms part of the side walls of the container when the halves are assembled;
B) at least a double wall construction;
C) the two substantially identical halves matingly engage when the halves are assembled into the container; and
D) means for securing the two halves together which is integral with each half In this document:

"at least double wall construction" means a wall formed of at least two partitions separated by a space between the partitions which are joined at their peripheries to form the double wall. The space between the at least two partitions may optionally include one or more additional walls or layers, corrugated sheet, open or closed cell foam material, air or another gas. The space between the at least two walls may be optionally collapsed in some or all areas such that the inner surfaces of each wall meet.

"Substantially identical" means functionally equivalent such that two substantially identical halves are interchangeable with each other and that both halves are capable of being produced from a single mold.

"Matingly engage" means that the two container halves mate or interlock with each other when one half is turned upside down and rotated 180 degrees with respect to the other half, and when thus mated they form the assembled container.

"Substantially orthogonal" means an angle of approximately ninety degrees formed between adjacent parts.

"No linear gap" means there is no direct line of sight through the seam between the mating halves in the assembled container.

"Substantially planar" means the major surface and the one or more side walls of each half can be formed from one approximately planar half with the one or more side walls to be folded to a position orthogonal to the major surface to be ready for assembly into the container.

"Static dissipative" means the surface resistance is generally in the range of $10^3$ to $10^{12}$ Ohms per square.

It is an advantage of the present invention to provide a reusable and volume-efficient container. It is another advantage of the present invention to provide a container made from two substantially identical parts. These parts can be produced from a single mold. It is another advantage of the present invention to provide a container that is refillable, reusable, and recyclable.

DETAILED DESCRIPTION

This invention is useful in the storage and shipping of items such as the silicon wafers common in the semiconductor industry. The container comprises two substantially identical halves. Both container halves can be produced from the same mold. The halves of the container can also be molded with integral hinges along fold lines to enable folding the sides toward the major surface so that they are approximately orthogonal to it. The sides can then be unfolded for shipping the halves flat to save space. The container of the present invention has many desirable industrial and environmental benefits. It protects the contents, it is inexpensive to produce and use, it occupies a minimum amount of space relative to a rectangular container when holding circular contents, it can keep the contents essentially free of dust and/or moisture contamination, and it is refillable, reusable and recyclable. An appropriate material selection can allow grinding and recycling of used or damaged container halves. Materials useful in the present invention with a suitable strength to weight ratio are known in the art. Two examples of such useful materials include polypropylene and high density polyethylene. A static dissipative material such as conductive carbon can be added to the wall material to impart static dissipative properties to the container.

Figure 1:
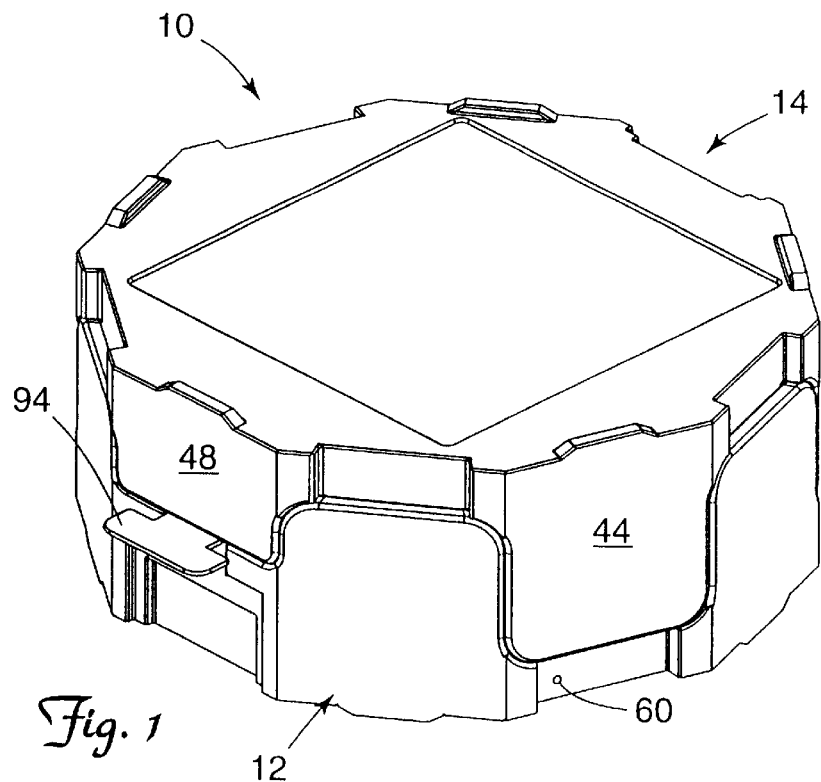
FIG. 1 is perspective view of an assembled container according to one embodiment of the present invention.
Figure 2:
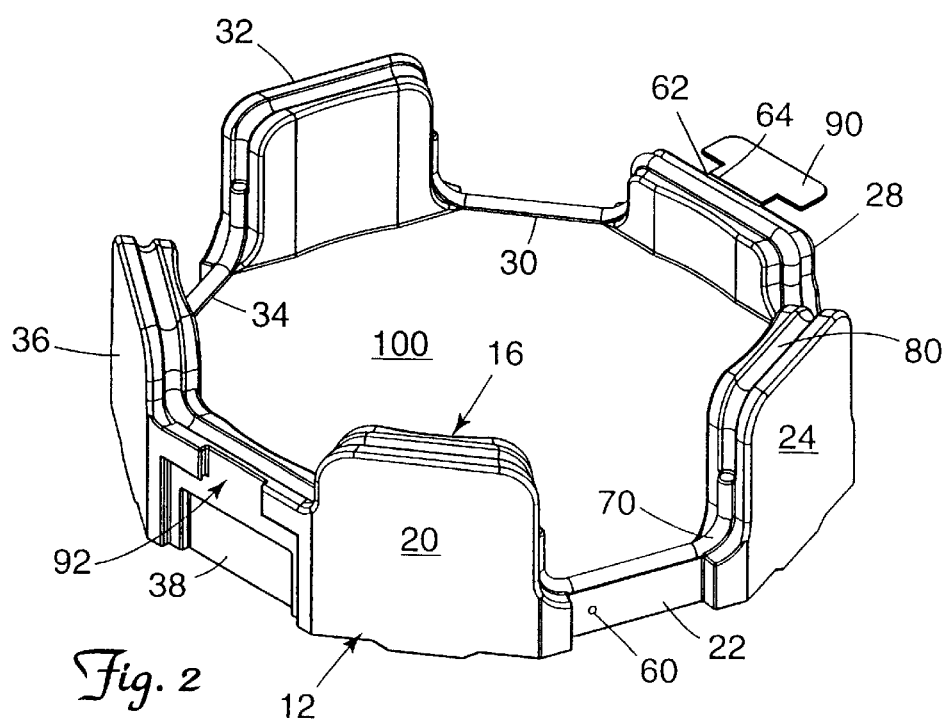
FIG. 2 is a perspective view of the first half of the container of FIG. 1.
Figure 3:
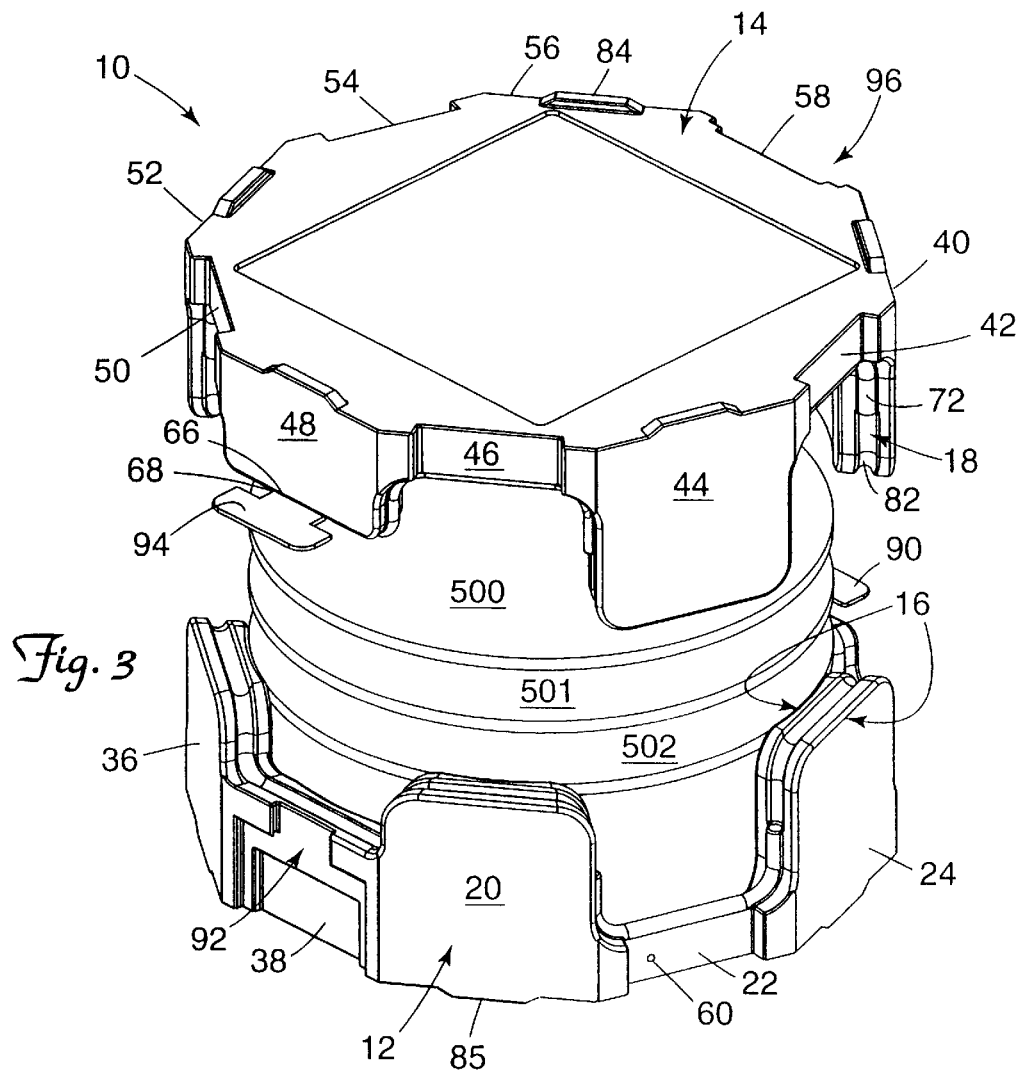
FIG. 3 is a perspective view of a partially assembled container of FIG. 1 containing wafers, with a second half being placed on the first half of FIG. 2.

FIGS. 1–3 illustrate container 10 according to one embodiment of the present invention. In this embodiment the container is formed from substantially identical first and second halves 12 and 14. FIG. 2 illustrates first half 12. Ten sides 20, 22, 24, 26 (not shown), 28, 30, 32, 34, 36, 38 are shown proceeding counterclockwise around the circumference of first half 12. Latch 90 is provided on side 28, opposite detent 92 provided on side 38. Alternating protrusions 70 and indentations 80 are provided in mating edge 16 along the ten sides. Ten sides 40, 42, 44, 46, 48, 50, 52, 54, 56, 58 are shown around the circumference of second half 14 in FIG. 3.

Referring to FIG. 3, the container is assembled starting with first half 12 and mating substantially identical second half 14 to first half 12 so that side 38 with detent 92 of first half 12 is adjacent side 48 with latch 94 of second half 14. The two halves 12 and 14 can then be matingly engaged by placing second half 14 on top of first half 12, as shown in FIG. 1. Integral hinge 64 formed along fold line 62 on side 28 of first half 12 is an arc or curved hinge allowing first latch 90 on side 28 of first half 12 to engage detent 96 on side 58 of second half 14 when container 10 is assembled. Similarly, integral hinge 66 formed along fold line 68 is an arc or curved hinge allowing second latch 94 on side 48 of second half 14 to engage detent 92 on side 38 of first half 12 to secure together both halves of container 10 after assembly.

Each protrusion 70 along mating edge 16 of the side walls of first half 12 corresponds to an opposing indentation 82 along mating edge 18 of the side walls of second half 14. Similarly, each indentation 80 along mating edge 16 of the side walls of first half 12 corresponds to an opposing protrusion 72 along mating edge 18 of the side walls of second half 14. These alternating protrusions 70 and 72 and indentations 80 and 82 can be formed such that no linear gap extends through the seam formed by the mating halves of assembled container 10, sealing out dust and other contaminants. Alternatively, mating edges 16 and 18 can complimentarily abut by means known to those skilled in the art.

One or more vent holes such as vent hole 60, shown on side 22 of first half 12, can be provided to allow air flow in and out of a cavity between the at least two walls. Vent hole 60 can be shaped and sized to control the rate of collapse of the at least double wall construction upon an impact, such as to prevent the rapid escape of air when the container experiences a shocking blow, yet allow the slower escape of air when the container is gently squeezed. The design of such vent holes is within the skill of the art. The interior shape of each half of the container can be designed to accommodate particular contents, such as wafers 500, 501, 502.

Figure 4:
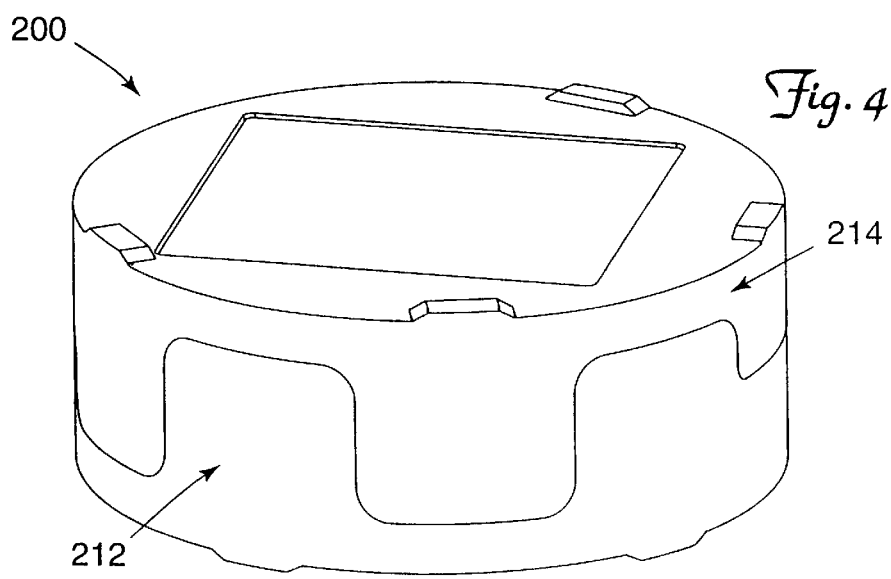
FIG. 4 is perspective view of an assembled container according to another embodiment of the present invention.
Figure 5:
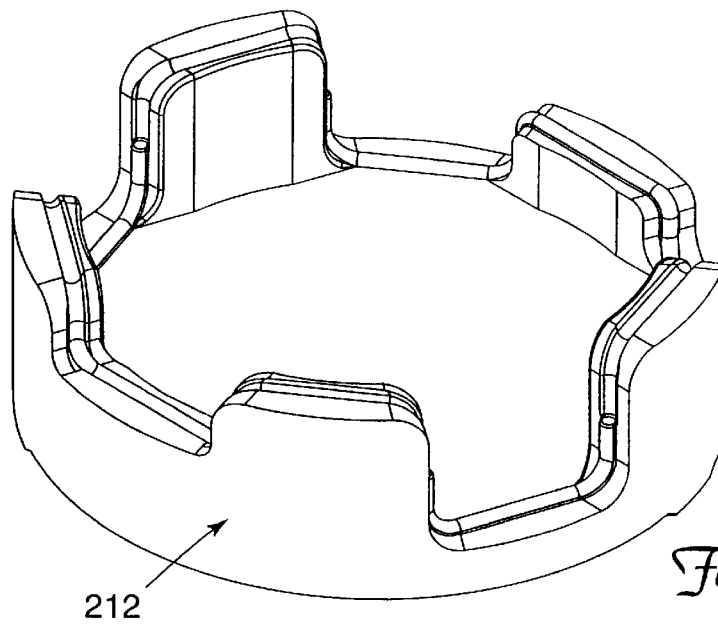
FIG. 5 is a perspective view of the first half of the container of FIG. 4.
Figure 6:
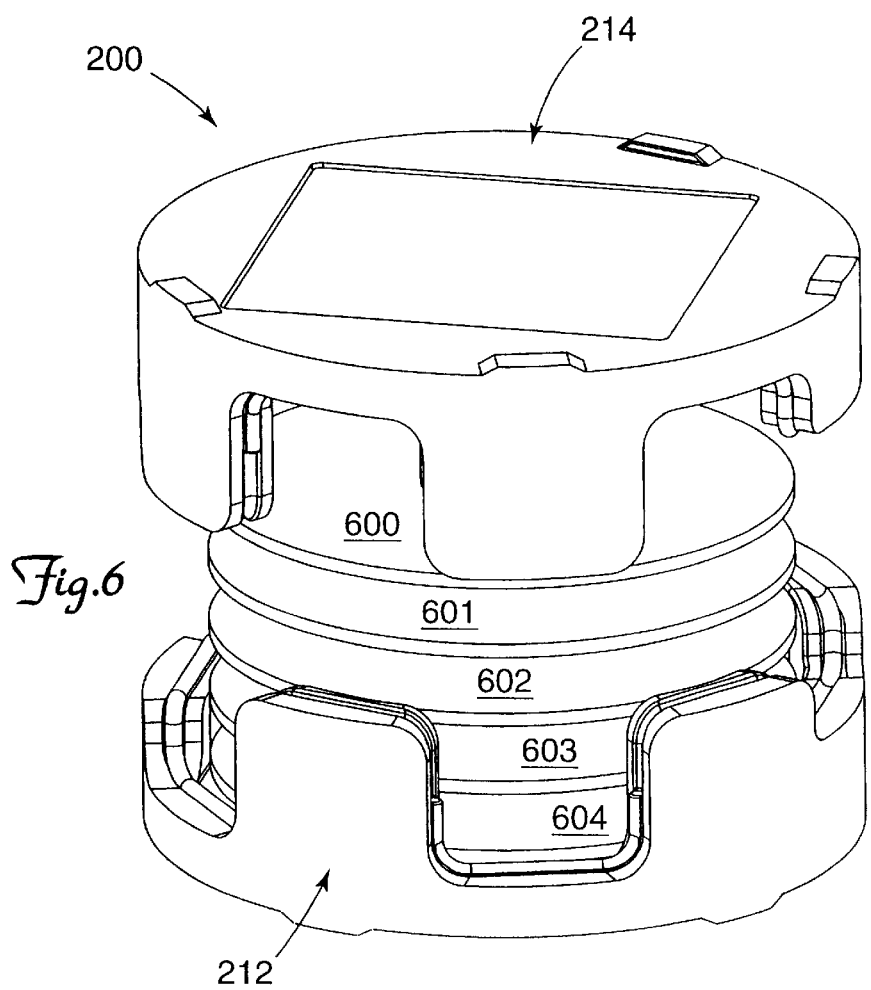
FIG. 6 is a perspective view of a partially assembled container according to FIG. 4 containing wafers, with a second half being placed on the first half of FIG. 5.

FIGS. 4–6 illustrate container 200 having a major surface with a curved periphery. Referring now to FIG. 6, the container is assembled starting with first half 212 and mating second half 214 to first half 212. The two halves 212 and 214 can be matingly engaged by placing second half 214 on top of first half 212, as shown in FIG. 4. The interior shape of each half of the container can be designed to accommodate particular contents, such as wafers 600, 601, 602, 603, 604.

Figure 7:
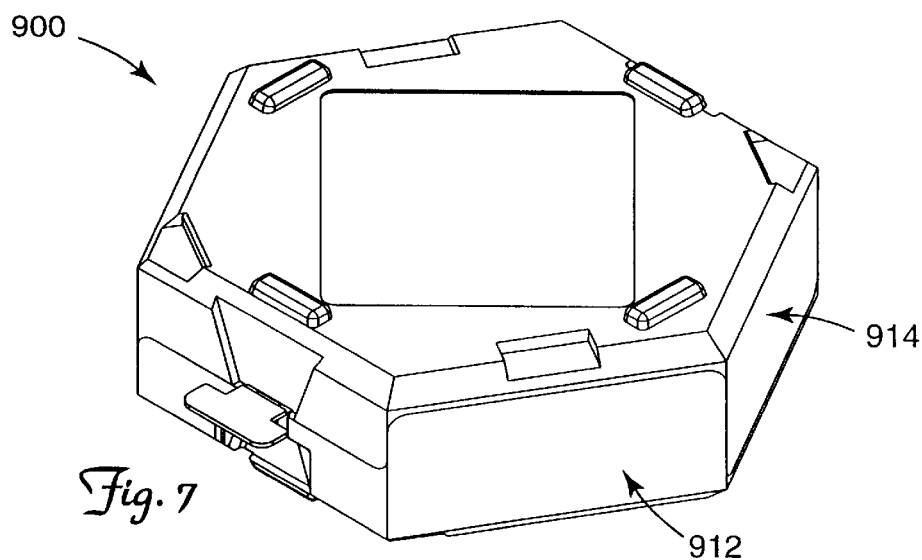
FIG. 7 is perspective view of an assembled container according to yet another embodiment of the present invention.
Figure 8:
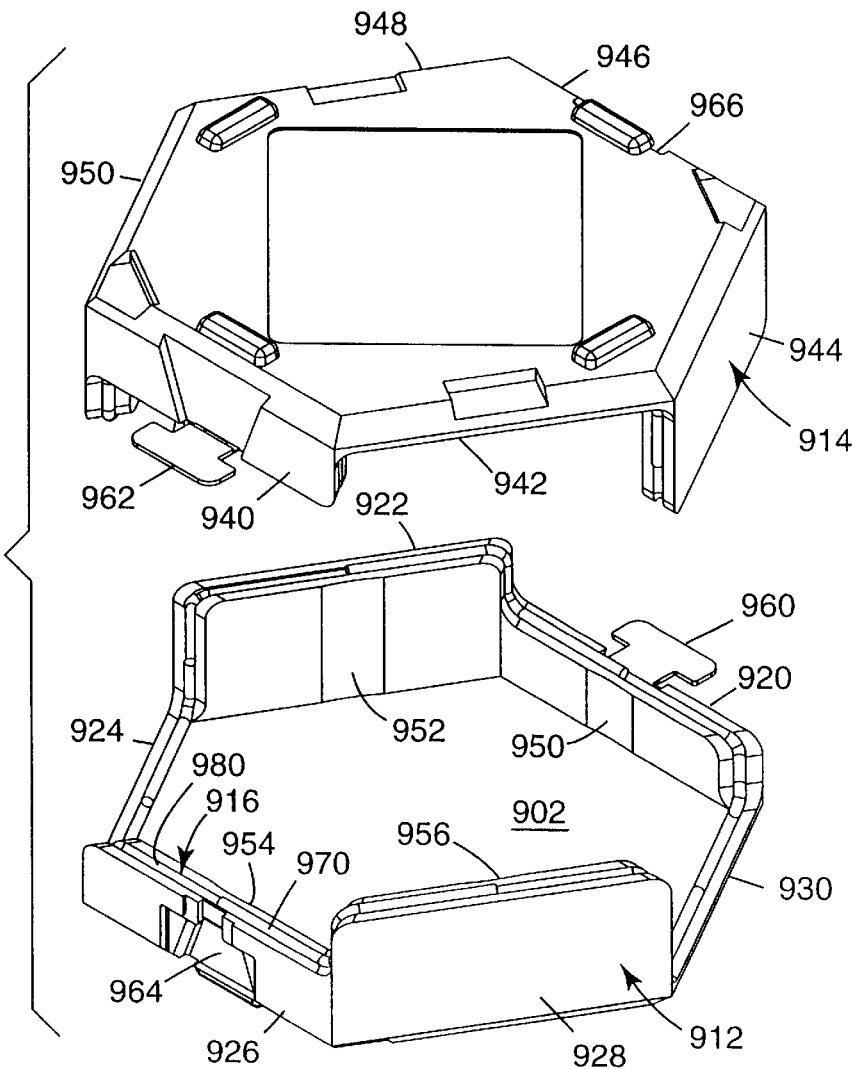
FIG. 8 is a perspective view of the separated halves of the container according to FIG. 7.

FIGS. 7–8 illustrate container 900 according to still another embodiment of the present invention. In this embodiment the container is formed from substantially identical first and second halves 912 and 914. FIG. 8 includes first half 912. Six sides 920, 922, 924, 926, 928, and 930 are shown proceeding counterclockwise around the circumference of first half 912. Latch 960 is provided on side 920, opposite detent 964 provided on side 926. Protrusions 970 and indentations 980 are provided in mating edge 916 along the sides. Six sides 940, 942, 944, 946, 948, and 950 are shown around the circumference of second half 914 in FIG. 8. The interior shape of each half of container 900 can be designed to accommodate particular contents. In this embodiment, shaped recesses 950, 952, 954 and 956 are included to accommodate contents with a circular periphery.

Referring to first half 912 in FIG. 8, side walls 922 and 928 are substantially full height, 920 and 926 are approximately one-half of the full height of side walls 922 and 928, and side walls 924 and 930 have substantially no height above major surface 902. The full height of a side wall is the distance between the bottom of one half of the container and the major surface of the second half of the container when the two halves are assembled into the container. First half 912 may be filled with the desired contents (e.g. wafers) with full height side walls 922 and 928 preventing spillage, while side access to the contents is provided at side walls 924 and 930. Each substantially full height side wall corresponds to a substantially no height side wall such that when the two halves of the container are assembled, these corresponding walls comprise the full height of the side wall of the container. Side walls 922 and 928 may be designed with greater than one-half of the full height and side walls 924 and 930 may be designed with less than one-half of the full height such that the sum of the heights selected comprises the full height.

Referring to FIG. 8, the container is assembled starting with first half 912 and mating substantially identical second half 914 to first half 912 so that side 920 with first latch 960 on first half 912 is adjacent side 946 with detent 966 of second half914. Correspondingly, side 926 with detent 964 of first half 912 is adjacent side 940 with latch 962 of second half 914. The two halves 912 and 914 can then be matingly engaged by placing second half 914 on top of first half 912, as shown in FIG. 7.

The halves of the container can be blow molded, providing a double wall construction with gas between the inner and outer walls. The gas-filled walls can act as a damper against shock and vibration.

Blow molding of plastics is a known process in industry. Blow molding usually involves placing a plastic piece called a preform, which may be a tubular shape, into an opened two-part mold. Given the part designs shown in the figures, the design of an appropriate mold is within the skill of the art. The mold is closed, heated, and air is injected into the heated preform to forcibly expand it against the mold walls. The mold is cooled, which also cools the newly-shaped part, then opened and the part is removed. Variations of blow molding include extrusion blow molding that uses an unsupported preform, injection blow molding that uses a preform supported such as with a metal pin, and stretch blow molding that begins with either extrusion or injection blow molding and follows with stretching the formed part. These variations of blow molding can each provide shock- and vibration-dampening gas-filled double wall construction. More detailed information may be found in pages 15–52 of the *Blow Molding Handbook*, D. Rosato and D. Rosato, editors, Hanser Publishers, New York (1989), which is herein incorporated by reference.

Coextrusion using two or more components can be used to prepare a multilayer preform for one or more characteristics including gas barriers, moisture barriers, printable surfaces, and/or scuff resistance. Coextrusion of more than one polymer to make an article having two or more layers is known in the art. In this technique, two or more extruders provide molten material to a coextrusion head from which a multilayer preform is extruded for use in blow molding as described above. More detailed information on coextrusion may be found on page 296 of the *Modern Plastics Encyclopedia*, Vol. 66, No. 11, R. Juran, ed., McGraw-Hill, New York (1989), which is herein incorporated by reference.

Alternatively, the halves of the container can be injection molded. An interior contour of each half of the container may be molded separately from an exterior contour of each half of the container. The interior and exterior contours may then be joined to form half of the container such as exemplified in first half 12 of FIGS. 1–3. Joining methods are known to those practicing in the art, including, for example, thermal, chemical (e.g. adhesives), ultrasonic and mechanical methods. Different materials may be selected for each contour to provide characteristics such as a more rigid exterior wall with a more flexible interior wall. Injection molding generally involves melting plastic then forcing the molten plastic into a closed two-part mold. The molten plastic is then cooled in the mold and it assumes the shape of the mold cavity. Then the mold is opened and the hardened part is ejected. More detailed information may be found in pages 286–293 of the *Modern Plastics Encyclopedia*, Vol. 66, No. 11, R. Juran, ed., McGraw-Hill, New York (1989), which is herein incorporated by reference.

Thermoforming is yet another method of producing the halves of the container. In this technique, pressure forces a preheated plastic sheet against a mold cavity, while vacuum may also be used to draw the sheet into the mold cavity. Twin sheet forming is a variation of this method that uses two input plastic sheets which are thermally bonded during the shaping process. More detailed information may be found in pages 318–322 of the *Modern Plastics Encyclopedia*, Vol. 66, No. 11, R. Juran, ed., McGraw-Hill, New York (1989), which is herein incorporated by reference.

The interior container shape can be designed to accommodate specific shapes, such as with one or more shaped recesses. The interior container shape can be different from the exterior container shape, which can be designed for easy stacking or use in automated equipment.

The exterior shape can include shaped recesses such as for grasping each half of the container to separate the halves after assembly. Shaped recesses can also be useful for labels. Shaped recesses may also be used to receive a protrusion from an adjacent container, such as when two or more containers are stacked. For example, FIG. 3 shows protrusion 84 on the top surface of container 10 near side wall 56 and side walls 54 and 58 include shaped recesses which can receive the protrusions to prevent slippage of stacked containers. Similarly, FIG. 3 shows protrusion 85 on the bottom surface of container 10 and side walls 22 and 38 include shaped recesses.

In a preferred embodiment, the halves can be formed of a material such as high density polyethylene for a strong yet lightweight container. The two halves can be formed from materials compatible with recycling.

Figure 9:
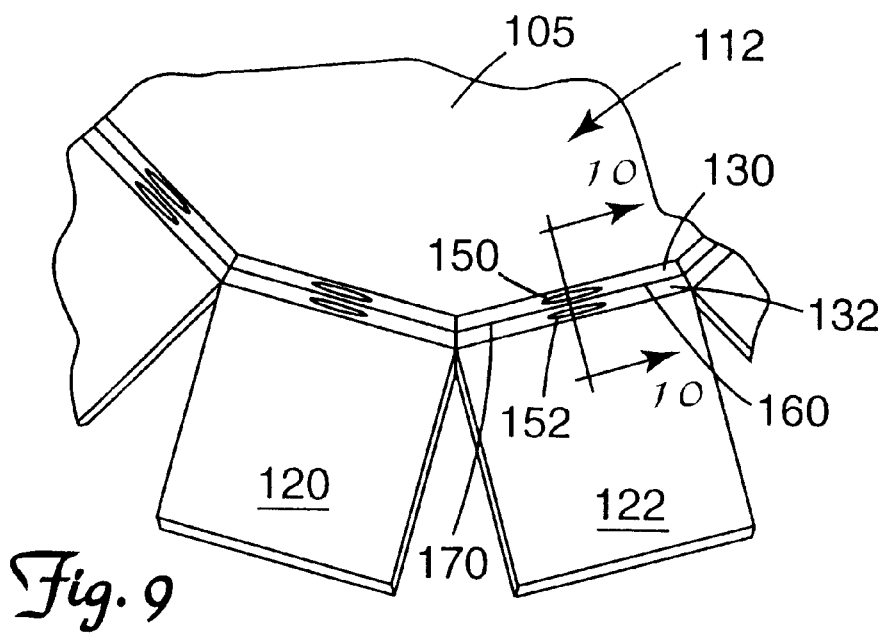
FIG. 9 is a partial top perspective view of a first half of an embodiment of the present invention.
Figure 10:
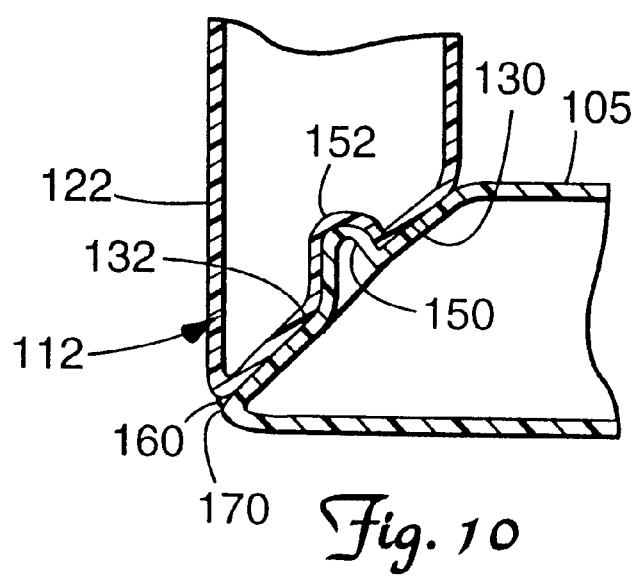
FIG. 10 is a cross-sectional detail view of a system of maintaining a side wall in a substantially orthogonal position along line 10—10 of FIG. 9.

The halves can be formed from a substantially planar workpiece. The side walls can then be folded toward the major surface to become substantially orthogonal to the major surface. Locking latches or similar devices can be used to hold the side walls in a position orthogonal to the major surface. In this version of the invention, the side wall edges adjacent the major surface and those that abut edges of other side walls in the assembled container may be beveled and joined by a hinge (such as an integral hinge) to the part of the container half forming the major surface as shown in FIGS. 9 and 10.

For convenience, the part of the container half forming the major surface will be called the major portion of the container half. FIG. 9 shows tab 150 and slot 152 located adjacent fold line 160 in container half 112. Tab 150 is located on beveled side 130 of major portion 105 that is adjacent side wall 122 and slot 152 is located in beveled side 132 of side wall 122. FIG. 10 shows further detail of this system for retaining the side walls in their substantially orthogonal positions, with tab 150 shown engaged in slot 152 and side wall 122 substantially orthogonal to major portion 105. Integral hinge 170 formed along fold line 160 is an arc or curved hinge which is biased in either a substantially flat orientation (FIG. 9) or in a substantially orthogonal orientation (FIG. 10). Like integral hinge 66 in FIG. 3, integral hinge 170 is made of the same polymer from which the container half is formed and is integral with the two parts, major portion 105 and side wall 122, that it joins.

Halves formed in this way can be designed to be returned to their substantially planar position such as for shipping. While this tab and slot system provides one way to hold the side walls substantially orthogonal to the major surface, other hinging and fastening means within the skill of the art are contemplated by the invention.

Numerous characteristics and advantages of the invention have been described in detail in the foregoing description with reference to the accompanying drawings. Various modifications and alterations of this invention will become apparent to those skilled in the art without departing from the scope and principles of this invention, and it should be understood that this invention is not to be unduly limited to the illustrative embodiments set forth hereinabove.

We claim:

1. A container having top, bottom, and side walls that comprises
   A) first and second substantially identical halves, each of which has a major surface that has a polygonal shape defined by at least six sides and at least one side wall, substantially orthogonal to the major surface, that forms a portion of the side walls of the container when the halves are assembled;
   B) at least a double wall construction comprising two walls having a space therebetween, and wherein at least one side wall has at least one vent hole, venting the space between the walls of the at least double wall construction;
   C) the two substantially identical halves matingly engage when the halves are assembled to form the container; and
   D) means for securing the two halves together which is integral with each half.

2. The container according to claim 1 further comprising at least six side walls including two or more side walls having greater than one-half of full height, two or more side walls having a height approximately one-half of full height; and two or more side walls having less than one-half of full height above the major surface.

3. The container according to claim 1 further comprising means for guiding and securing the two halves along their respective edges to form a seal around the container.

4. The container according to claim 3 wherein the seal is designed such that no linear gap extends from the exterior of the assembled container into the interior of the assembled container.

5. The container according to claim 1 wherein the securing means comprises a protrusion molded into at least one side wall and a detent corresponding to each protrusion, each detent being molded into a corresponding side wall so that each protrusion of a first half of the container can engage one detent of a second half of the container and each protrusion of the second half of the container can engage one detent of the first half of the container.

6. The container according to claim 1 further having an interior container shape different from the exterior container shape.

7. The container according to claim 1 further comprising a static dissipative material.

8. The container according to claim 1 wherein at least one major surface includes a shaped recess.

9. The container according to claim 1 wherein each half is a substantially planar workpiece having portions which form the side walls by being folded.

10. The container according to claim 9 further comprising means for retaining the side walls in a position folded orthogonal to the major surface.

* * * * *